United States Patent
Narasimhan et al.

(10) Patent No.: US 11,095,941 B2
(45) Date of Patent: Aug. 17, 2021

(54) SYSTEMS AND METHODS FOR USE IN IMPOSING NETWORK LOAD RESTRICTIONS

(71) Applicant: MASTERCARD INTERNATIONAL INCORPORATED, Purchase, NY (US)

(72) Inventors: Prasanna Srinivasan Narasimhan, O'Fallon, MO (US); Ragunath Venkatapathy, O'Fallon, MO (US)

(73) Assignee: MASTERCARD INTERNATIONAL INCORPORATED, Purchase, NY (US)

( * ) Notice: Subject to any disclaimer, the term of this patent is extended or adjusted under 35 U.S.C. 154(b) by 0 days.

(21) Appl. No.: 16/586,387

(22) Filed: Sep. 27, 2019

(65) Prior Publication Data

US 2021/0099758 A1    Apr. 1, 2021

(51) Int. Cl.
*H04N 21/454* (2011.01)
*H04L 29/06* (2006.01)
*G06F 30/20* (2020.01)
*G06F 17/18* (2006.01)

(52) U.S. Cl.
CPC .......... *H04N 21/454* (2013.01); *G06F 17/18* (2013.01); *G06F 30/20* (2020.01); *H04L 65/4084* (2013.01)

(58) Field of Classification Search
None
See application file for complete search history.

(56) References Cited

U.S. PATENT DOCUMENTS

| | | | | |
|---|---|---|---|---|
| 2014/0362697 A1* | 12/2014 | Desnoyer | ............... | H04L 67/02 370/230.1 |
| 2019/0045014 A1* | 2/2019 | Shaw | .................. | H04L 67/1029 |
| 2020/0053405 A1* | 2/2020 | Li | .................... | H04N 21/44204 |

OTHER PUBLICATIONS

Karan Desai, Yoshihisa Nakatani; Visitor Prioritization on e-Commerce Websites with CloudFront and Lambda@Edge, Jul. 30, 2018, 11 pages (Year: 2018).*
"Visitor Prioritization on e-Commerce Websites with CloudFront and Lambda@Edge", https://aws.amazon.com/blogs/networking-and-content-delivery/visitor-prioritization-on-e-commerce-websites-with-cloudfront-and-lambdaedge/; Jul. 30, 2018; 11 pgs.

* cited by examiner

*Primary Examiner* — Hsiungfei Peng
(74) *Attorney, Agent, or Firm* — Harness, Dickey & Pierce, P.L.C.

(57) ABSTRACT

Systems and methods are provided that relate to imposing a restriction on requests for content by clients to a backend content source. One exemplary method includes generating, by a computing device associated with a backend content source, a restriction value for content of the backend content source, based on a number of supported requests for the content by the backend content source, and transmitting the restriction value to a content delivery network (CDN) interposed between one or more clients associated with the requests and the backend content source. The method then includes routing, by the CDN, a percentage of requests for the content of the backend content source to a waiting room based on the restriction value, thereby permitting the CDN to account for the number of supported requests in offloading requests for the content to the waiting room.

18 Claims, 3 Drawing Sheets

SYSTEMS AND METHODS FOR USE IN IMPOSING NETWORK LOAD RESTRICTIONS

FIELD

The present disclosure generally relates to systems and methods for use in imposing network load restrictions, and more specifically, to systems and methods for use in setting throughput for networks based on supported network requests.

BACKGROUND

This section provides background information related to the present disclosure which is not necessarily prior art.

Networks are known to deliver content to clients in response to requests from the clients. The content is often delivered from a backend system, which may be a single server or a group of servers arranged in one or more network topologies. A content delivery network or CDN is known to then deliver content from the backend server(s), through a geographically distributed group of servers, to the clients in response to the requests from the clients.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Exemplary embodiments will now be described more fully with reference to the accompanying drawings. The description and specific examples included herein are intended for purposes of illustration only and are not intended to limit the scope of the present disclosure.

When networks provide content to a client, client experience is often affected by the availability of the content and performance of the network in delivering the content. For instance, when the number of requests to a backend content source exceeds capabilities of the backend content source, the client experience is affected in a negative way through poor performance. In connection therewith, client requests may be offloaded to a waiting room, by the network, whereby the client is informed of the wait rather than simply experiencing poor performance. The number of requests offloaded to the waiting room (i.e., a threshold) may be fixed, for a given number of requests (e.g., a percentage), or it may be based on the expected or historical number of requests. This may be problematic in situations where surges of requests are received from clients, whereby either the network offloads too many requests in attempt to account for a potential surge (i.e., thereby underutilizing the backend content source) or the network offloads too few requests whereby a surge will cause poor performance (i.e., thereby over utilizing the backend content source). As such, when setting the threshold in this manner, the backend content source itself (and the actual capabilities of the backend content source, for example) does not impact the threshold.

Uniquely, the systems and methods herein impose load restrictions, whereby requests are offloaded to a waiting room, through the network, based on a supported number of requests, by the backend content source. In particular, each backend content source exposes an application, for example, which itself, or based on its dependences on other assets (e.g., APIs, databases, etc.), is capable, at a given time, to support a certain number of requests. By including this supported number of request in the determination of the threshold for requests passed to the backend content source, versus the waiting room, the threshold is tied to the actual backend content source capabilities, thereby providing enhanced ability to avoid poor performance (and avoiding passing too few or too many requests to the waiting room).

Figure 1:
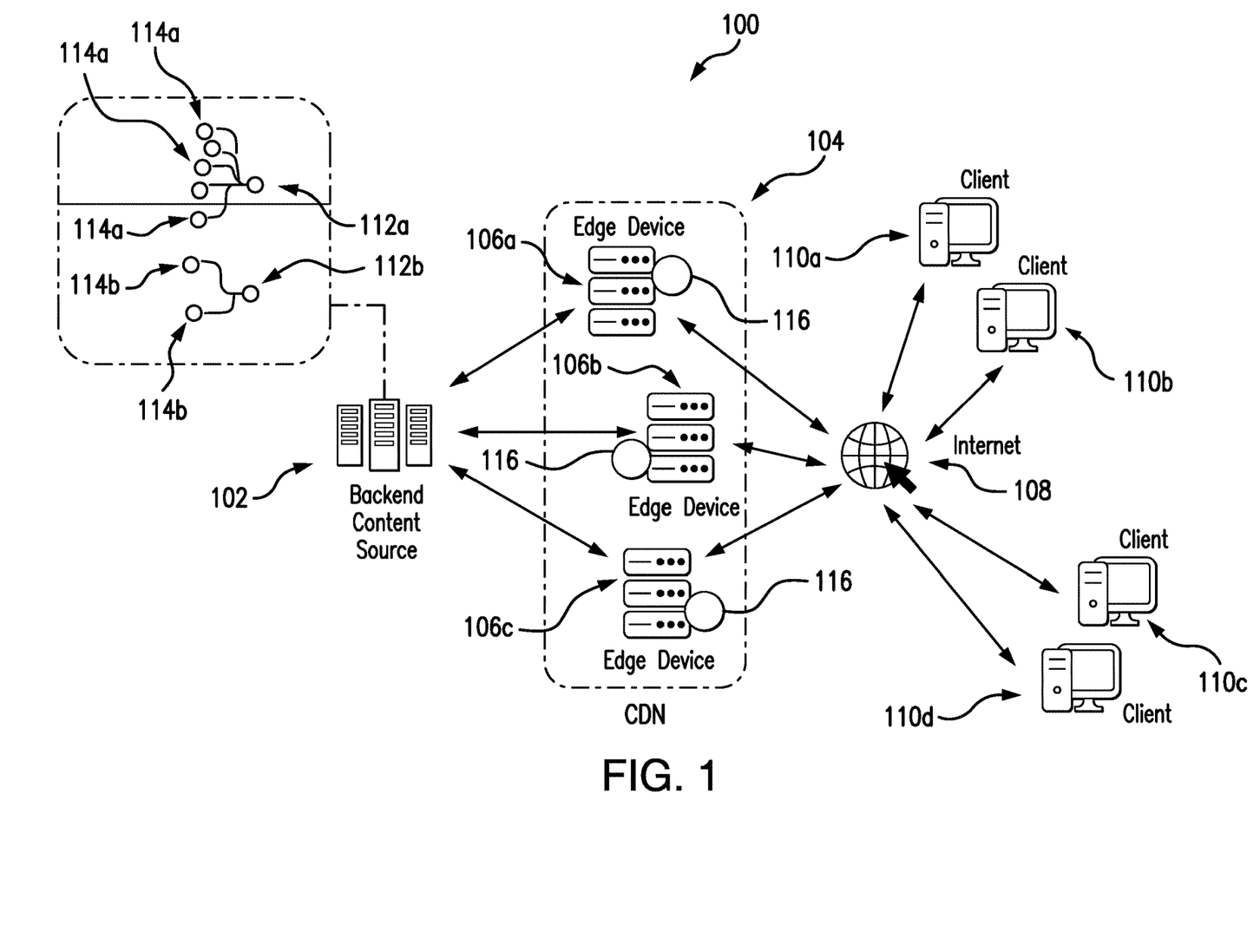
FIG. 1 illustrates an exemplary system of the present disclosure suitable for use in imposing load restrictions on network requests to a backend content source.

FIG. 1 illustrates an exemplary system 100 in which one or more aspects of the present disclosure may be implemented. Although parts of the system 100 are presented in one arrangement, it should be appreciated that other exemplary embodiments may include the same or different parts arranged otherwise, depending on, for example, numbers and types of content sources, networks employed, types and demand for content delivered, and/or volume of requests from clients in the system 100, etc.

As shown in FIG. 1, the illustrated system 100 generally includes a backend content source 102, a content delivery network (CDN) 104 comprising edge devices 106a-c, the Internet 108, and multiple different client devices 110a-d (broadly, clients), each coupled to (and in communication with) one or more networks, as indicted by the arrowed lines. Each of the one or more networks may include, without limitation, a wired and/or wireless network, a local area network (LAN), a wide area network (WAN) (e.g., the Internet, etc.), a mobile network, and/or another suitable public and/or private network capable of supporting communication among two or more of the illustrated components of the system 100, or any combination thereof (including, for example, the internet 108, etc.).

The backend content source 102 is configured to provide content to the client devices 110a-d, in response to requests from the client devices 110a-d. As shown in FIG. 1, the content, in this exemplary embodiment (as indicated by the dotted box), includes access to applications 112a-b. The applications 112a-b may include an application such as, for example, the MasterPass® digital wallet, a secure remote commerce (SRC), the Mastercard® Performance Marketing, the Mastercard® Developer Zone, etc. While the content is provided as the specific applications 112a-b in FIG. 1, it should be appreciated that other applications and/or other types of content may be provided from the backend content source 102 in other system embodiments (whereby the applications 112a-b illustrated in FIG. 1 are merely exemplary in nature).

Each of the applications 112a-b (broadly, the content) includes multiple dependences, such as dependencies 114a of application 112a and dependencies 114b of application 112b. Specifically, as illustrated, the application 112a includes five dependencies 114a, and the application 112b includes two dependencies 114b. The dependencies 114a-b may be to any asset included inside or outside of the backend content source 102. For example, the dependencies 114a-b may include different APIs or databases, such as, for example, those which provide authentication services, billing services, rewards services, etc. In connection therewith, some of the dependencies 114a-b may be shared by the applications 112a-b (and/or by other content from the backend content source 102), while others may be specific to the application 112a or the application 112b. As an example, one application may include the MasterPass® digital wallet application, having the following dependencies: Crypto as a service (CAAS), Mastercard® API Gateway, Enterprise Security Services (ESS), and Email & SMS Gateway; etc. And, another application may include the SRC application, having the following dependencies: Crypto as a service (CAAS) and Mastercard® API Gateway, etc. In connection therewith, the CAAS and Mastercard® API Gateway dependencies may be shared between the MasterPass® digital wallet application and the SRC application.

Based on the applications 112a-b and the dependencies 114a-b, the backend content source 102 defines a supported number of requests for each of the applications 112a-b. The supported number of requests may be variable and/or dynamic, as dependencies become available or unavailable (e.g., when a server is down, when a dependency is further shared by other content, etc.). As an example, Table 1 below illustrates the five dependencies 114a over time for the application 112a (i.e., from time 19:00 to 19:03) at the backend content source 102.

for example, individual users, consumers, employees, business entities, government entities, etc.; other computing devices; etc. The content may be requested for reasons related to business or personal purposes, education, entertainment, or otherwise. In the example of FIG. 1, where the application 112a includes the MasterPass® digital wallet, the content may be requested, by a user associated with client device 110a, to initiate and/or a fund a transaction with a merchant (not shown).

While only one backend content source 102, one CDN 104 (having three edge devices 106a-c), one Internet 108, and four client devices 110a-d are illustrated in FIG. 1, it should be appreciated that any number of these parts of the system 100, as described herein, may be included in other embodiments. Likewise, different content may be provided by other backend content sources, which include different applications and/or dependencies, in other embodiments.

Figure 2:
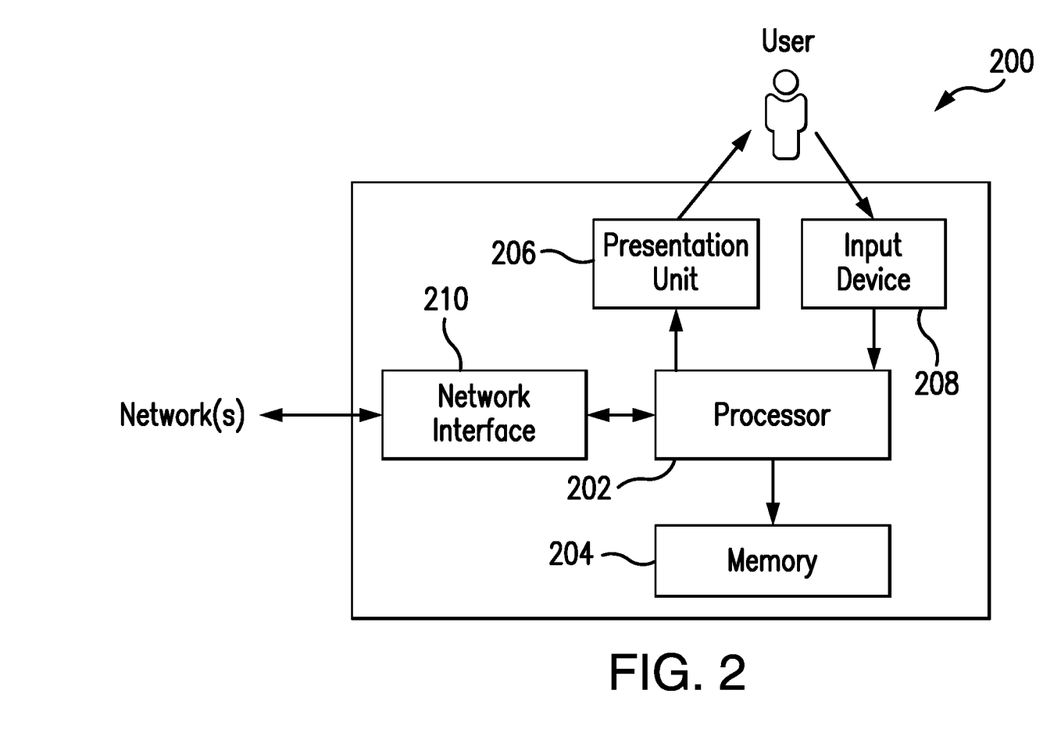
FIG. 2 is a block diagram of an exemplary computing device that may be used in the system of FIG. 1.

FIG. 2 illustrates an exemplary computing device 200 that can be used in the system 100. The computing device 200 may include, for example, one or more servers, workstations, personal computers, laptops, tablets, smartphones, other communication devices, POS terminals, payment devices, etc. In addition, the computing device 200 may include a single computing device, or it may include multiple computing devices located in close proximity or distributed over a geographic region, so long as the computing

TABLE 1

| Time (HH:MM) | Avg. CPU (%) | Avg. Mem (%) | Avg. BW Util. (%) | Dep1 | Dep2 | Dep3 | Dep4 | Dep5 | Supported No. of Requests (S) |
| --- | --- | --- | --- | --- | --- | --- | --- | --- | --- |
| 19:00 | 5.10 | 15.01 | 0.12 | 1 | 1 | 1 | 1 | 1 | 24.5 |
| 19:01 | 4.0 | 12.10 | 0.09 | 1 | 0 | 1 | 1 | 1 | 1.0 |
| 19:02 | 4.5 | 13.05 | 0.18 | 1 | 1 | 1 | 1 | 1 | 24.7 |
| 19:03 | 6.0 | 15.0 | 0.13 | 1 | 1 | 1 | 1 | 1 | 23.8 |

As shown, in this example, the five dependencies 114a associated with the application 112a (i.e., that the application is dependent on) includes Dep1 through Dep5. What's more, in this example, the server, service or assets associated with Dep2, is/are down or unavailable at time 19:01, whereby the supported number of request (S) drops to 1.0. As will be appreciated (and as will be discussed more hereinafter), this impacts a restriction threshold associated with the application 112a. In connection therewith, determination of the supported number of requests may be based on a stochastic prediction model using, for example, Monte Carlo simulation, etc. such that supported transactions at a given time may be derived to accommodate normal and reduced availability situations (e.g., with regard to the dependencies of the give application, etc.).

With continued reference to FIG. 1, the three edge devices 106a-c of the CDN 104 are disposed at different geographic locations. In general, the edge devices 106a-c will be located in the vicinity of, or close to, the client devices 110a-d (although this is not required in all implementations of the system 100). And, the Internet 108 is then disposed in a manner to provide connectivity between the client devices 110a-d and the edge devices 106a-c.

In addition, each of the client devices 110a-d may be associated with any different client, which provides one or more requests for content from the backend content source 102 (e.g., through the given one of the client devices 110a-d, etc.). In connection therewith, the client devices 110a-d may generally include communication devices associated with, devices are specifically configured to function as described herein. In particular, in the exemplary system 100 of FIG. 1, each of the backend content source 102, the edge devices 106a-c, the Internet 108, and the client devices 110a-d may include, or may be implemented in, one or multiple computing devices consistent with the computing device 200. In addition, each of the applications 112a-b and/or the dependencies 114a-b associated therewith may be hosted in and/or provided through one or more computing device (e.g., a server, etc.) generally consistent with the computing device 200. That said, the system 100 should not be considered to be limited to the computing device 200, as described below, as different computing devices and/or arrangements of computing devices may be used. In addition, different components and/or arrangements of components may be used in other computing devices.

With reference now to FIG. 2, the computing device 200 generally includes a processor 202, and a memory 204 that is coupled to (and in communication with) the processor 202. The processor 202 may include, without limitation, one or more processing units (e.g., in a multi-core configuration, etc.), including a general purpose central processing unit (CPU), a microcontroller, a reduced instruction set computer (RISC) processor, an application specific integrated circuit (ASIC), a programmable logic device (PLD), a gate array, and/or any other circuit or processor capable of the functions described herein. The above examples are exemplary only, and are not intended to limit in any way the definition and/or meaning of processor.

The memory 204, as described herein, is one or more devices that enable information, such as executable instructions and/or other data, to be stored and retrieved. The memory 204 may be configured to store, without limitation, different content, request data (e.g., historical request data, supported request numbers, etc.), desired thresholds, and/or other types of data suitable for use as described herein, etc. In addition, the memory 204 may include one or more computer-readable storage media, such as, without limitation, dynamic random access memory (DRAM), static random access memory (SRAM), read only memory (ROM), erasable programmable read only memory (EPROM), solid state devices (e.g., EMV chips, etc.), CD-ROMs, thumb drives, tapes, flash drives, hard disks, and/or any other type of volatile or nonvolatile physical or tangible computer-readable media. It should be appreciated that the memory 204 may include a variety of different memories. In various embodiments, computer-executable instructions may be stored in the memory 204 for execution by the processor 202 to cause the processor 202 to perform one or more of the operations described herein (e.g., one or more of the operations recited in method 300, etc.), such that the memory 204 is a physical, tangible, and non-transitory computer-readable media and such that the instructions stored in the memory 204 enable the computing device to operate as a specific-purpose device to effect the features described herein (and achieve the practical applications of the present disclosure).

The computing device 200 also includes a presentation unit 206 and an input device 208 coupled to (and in communication with) the processor 202.

The presentation unit 206 outputs information and/or data to a user by, for example, displaying, audibilizing, and/or otherwise outputting the information and/or data. In some embodiments, the presentation unit 206 may comprise a display device such that various interfaces (e.g., application interfaces or other content, etc.) may be displayed at the computing device 200, and in particular at a display device associated with the presentation unit 206, to display such information and/or data, etc. With that said, the presentation unit 206 may include, without limitation, a cathode ray tube (CRT), a liquid crystal display (LCD), a light-emitting diode (LED) display, an organic LED (OLED) display, an "electronic ink" display, speakers, combinations thereof, etc. In addition, the presentation unit 206 may include multiple devices in some embodiments. And, the input device 208, when present in the computing device 200, is configured to receive input from a user. The input device 208 may include, without limitation, a keyboard, a mouse, a touch sensitive panel (e.g., a touch pad or a touch screen, etc.), another computing device, and/or an audio input device. Further, in some exemplary embodiments, a touch screen, such as that included in a tablet, a smartphone, or similar device, may function as both the presentation unit 206 and the input device 208.

The illustrated computing device 200 further includes a network interface 210 coupled to (and in communication with) the processor 202 and the memory 204. The network interface 210 may include, without limitation, a wired network adapter, a wireless network adapter, a mobile adapter, or other device capable of communicating to one or more different networks (e.g., the Internet 108, a private or public LAN, WAN, mobile network, combinations thereof, or other suitable network, etc.). In some exemplary embodiments, the processor 202 and one or more network interfaces may be incorporated together.

Referring again to FIG. 1, in connection with offering content associated with the backend content source 102, the CDN 104 is configured to receive content requests from the client devices 110a-d (again, broadly, from the clients associated with the client devices 110a-d), via the Internet 108, and to pass the content requests to the backend content source 102. In turn, the CDN 104 is then also configured to pass content from the backend content source 102 to the client devices 110a-d (again via the Internet 108), in response to the requests, when such content is provided by the backend content source 102.

In addition, the CDN 104 is configured to employ a waiting room in connection with each of the edge devices 106a-c (where each of the edge devices 106a-c then includes such a waiting room 116), and a restriction value associated with the waiting room 116. Each waiting room 116 includes a location associated with the CDN 104 where requests can be temporarily held when the backend content source 102 is experiencing high volumes of requests, and where the clients (at the client devices 110a-d) associated with the requests are informed of the wait rather than simply experiencing poor performance. And, the restriction value defines the percentage of content requests passed and/or probability of a content request being passed to the backend content source 102. In connection therewith, the backend content source 102 may be configured to determine the restriction value and apply it through one or more waiting room application programming interfaces (APIs), which operate as control centers to visualize and/or configure the restriction value. With that said, as an example, where the restriction value is 0.8 for the backend content source 102, about 80% of content requests received by the edge device 106a will be passed by the CDN 104 to the backend content source 102, while about 20% of content requests will be offloaded or passed to the waiting room 116 of the edge device 106a. While, in this example, the restriction value is provided on a scale of 0 to 1, it should be appreciated that the restriction value may be expressed in other manners and/or on other scales in other system embodiments. In addition, it should be appreciated that, for each of the edge devices 106a-c, the corresponding waiting room 116 may be included therein either logically or physically.

While the CDN 104 employs the restriction value in managing content requests through the various edge devices 106a-c (and determining which content request(s) to pass to the backend content source 102 and which request(s) to pass to a corresponding waiting room 116), the backend content source 102 itself is configured to determine the restriction value. In so doing, in this exemplary embodiment, the backend content source 102 is configured to determine a current number of requests (C), a supported number of requests (S), and an expected number of requests (E). With the C, S, and E values, the backend content source 102 is configured to then determine the restriction value (RV) based on Equation 1 below. In short, the restriction value is 1 minus the mean of the ratio of the current number of requests (C) over the supported number of requests (S) to the expected number of requests (E) over the supported number of requests (S).

$$RV = 1 - \text{mean}\left(\frac{C}{S}, \frac{E}{S}\right) \qquad (1)$$

Table 2 illustrates an exemplary determination of the restriction value (RV) for four different time intervals for the backend content source 102, where the restriction value is based on the current, supported and expected number of requests for the application 112a, based on Equation 1, and where the restriction value is bounded between 0 and 1 (or between 0 and 100%, etc.). A similar determination may be implemented for the application 112b. That said, it should be appreciated that the restriction value may be limited otherwise between a maximum, P (other than 1), and a minimum, Q (other than 0), whereby Q<RV<P (e.g., 0.15<RV<0.90; etc.).

TABLE 2

| Time (HH:MM) | Current No. of Requests (C) | Expected No. of Requests (E) | Supported No. of Requests (S) | Restriction Value (RV) | Notes |
|---|---|---|---|---|---|
| 19:00 | 7.2 | 8.4 | 24.5 | 68.16% | Stable |
| 19:05 | 5.6 | 13.4 | 24.7 | 61.53% | Stable |
| 19:10 | 19.1 | 22.0 | 1.0 | 1% | Poor |
| 19:15 | 17.4 | 18.9 | 23.8 | 23.37% | Poor |

With that said, in certain situations, the RV may be limited to a predefined minimum value (e.g., 1, a value less than 1, etc.), whereby Equation 1 generally governs the RV and is still subject to certain constraints. For instance, in the above example illustrated in Table 2, the RV at time 19:10 is limited to a predefined minimum value of 1%. In other embodiments, the minimum value may be zero, whereby, consistent with the description below, all requests would be directed (by the CDN 104) to the corresponding waiting room 116 of the given one of the edge devices 106a-c.

It should be appreciated that other equations or algorithms (other than Equation 1) may be employed, which rely on the supported number of requests for the application 112a (and/or for the application 112b) for determining the restriction value for the application 112a (and/or the application 112b) (e.g., in combination with the current number of requests and/or the expected number of requests, or apart therefrom; etc.). In a further exemplary embodiment, the restriction value may be determined as the current number of requests divided by the supported number of request for a given content. Here, in a simplified example, where a current number of requests for application 112b is 8, and the supported number of requests for application 112b is 9, the backend content source 102 may be configured to determine a restriction value (based on this further exemplary embodiment) of 0.88 (i.e., ⅛), which will have the result of routing a portion of the requests to the corresponding waiting room 116.

When the restriction value is determined in the system 100, the backend content source 102 is configured to transmit the restriction value to the CDN 104. In response, the CDN 104 is configured to implement the restriction value, thereby setting the probability of a request being passed along to the backend content source 102, versus being offloaded and/or routed to a waiting room 116 within the CDN 104.

As such, when a request is received at the CDN 104, and in particular, at one of the edge devices 106a-c, the CDN 104 is configured to generate a value for the request, which is based on, in this embodiment, a random number generator (e.g., where generation of the value may take into account ease of selection of the number based on the number of edge devices 106a-c, etc.). The CDN 104 is configured to then compare the value for the request to the restriction value. When the value is less than (or equal to) the restriction value (in this example), the CDN 104 is configured to pass the request to the backend content source 102. In response, the backend content source 102 is configured to fulfill the request, as is appropriate for the given request (e.g., provide the requested content, expose the application 112a (as dependent on dependencies 114a) as requested, etc.). Alternatively, when the value for the request is greater than the restriction value, the CDN 104 is configured to route the request to the waiting room 116 of the CDN 104 associated with the corresponding one of the edge devices 106a-c through which the request is received, and notify the one of the client devices 110a-d associated with the request. Requests from the waiting room 116 may then be released automatically after a configured interval controlled, for example, by the CDN 104, and returned to the application 112a (or application 112b) as an original request where it will be treated as a new request and will be subjected to new derived RV values.

It should be appreciated that, from time to time, based on one or more regular or irregular intervals, the backend content source 102 is configured to update the restriction value consistent with the above description and to transmit the updated restriction value to the CDN 104, whereby the updated value is then implemented in the CDN 104 (in the manner described above).

Figure 3:
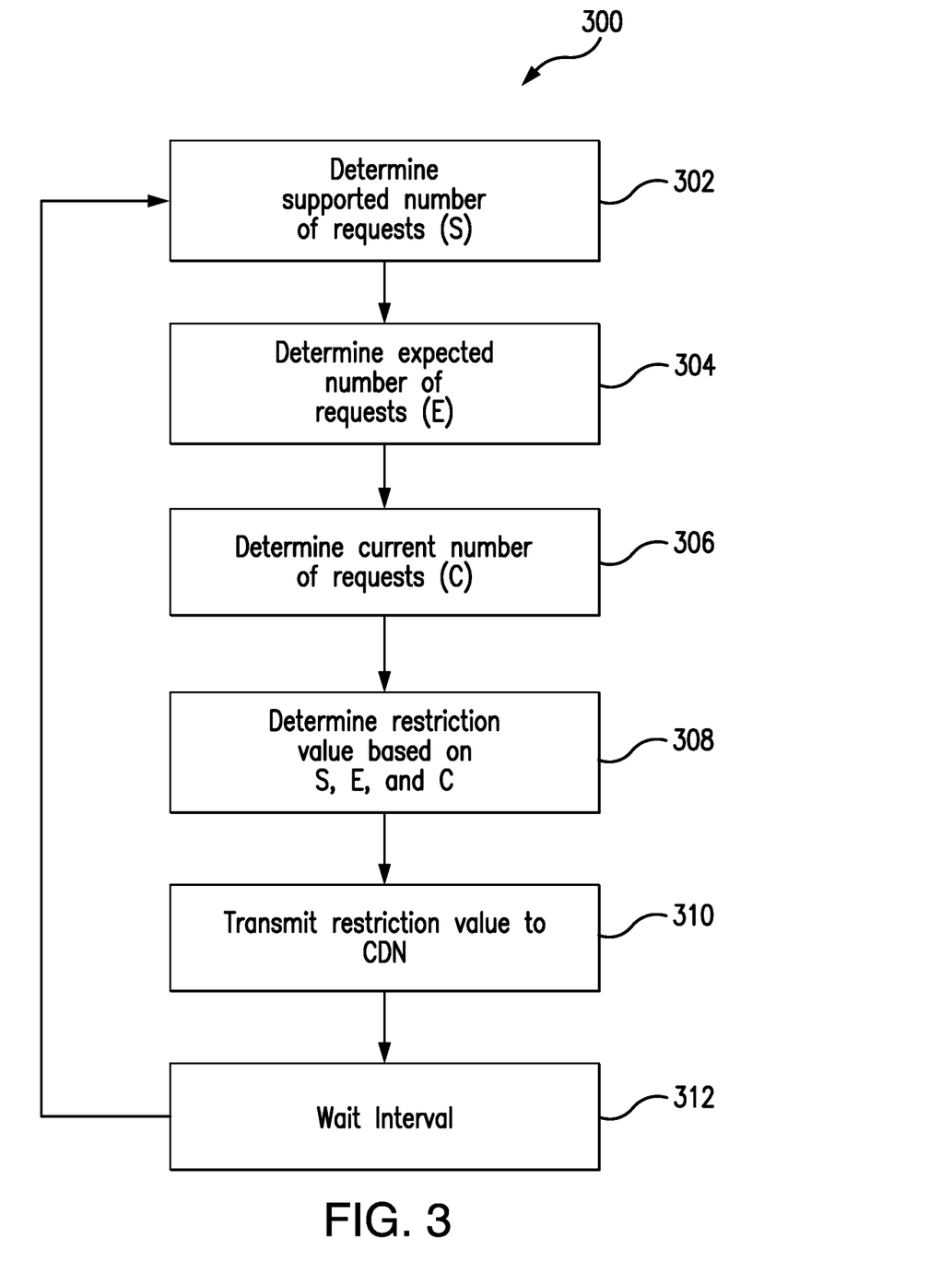
FIG. 3 is an exemplary method, suitable for use with the system of FIG. 1, for imposing load restrictions on network requests to a backend content source based on a supported number of requests for the backend content source.

FIG. 3 illustrates an exemplary method 300 of imposing a restriction on requests passed to a backend content source, in connection with client requests for content from the backend content source. The method 300 is described below in connection with the exemplary system 100 of FIG. 1 and the exemplary computing device 200 of FIG. 2. However, it should be appreciated that the method 300 is not limited to the system 100 or the computing device 200, but may be implemented in a variety of different systems and/or computing devices. Likewise, the systems and computing devices described herein should not be understood to be limited to the exemplary method 300, or other methods described herein.

The method 300 is described with reference to the application 112a and addressing content requests directed thereto. But it should be appreciated that the method 300 also applies to application 112b. That said, initially in the method 300, the backend content source 102 determines, at 302, a supported number of requests (S) for the application 112a (e.g., for use in Equation 1, etc.) at the backend content source 102. Specifically, for example, the backend content source 102 calculates the supported number of requests (S) through stochastic prediction (e.g., via Monte Carlo simulation, etc.) and supplies it to the RV calculation (e.g., at 308 in the method 300). The supported number of requests (S) may be expressed in transactions per second (TPS), etc.

Referring to Table 1, for example, the supported number of requests (S) for the application 112a may be determined based on the average CPU percentage for the backend content source 102, the average memory percentage for the backend content source 102, the average bandwidth utilization percentage at the application 112a, and the availability of dependent services for the application 112a at the backend content source 102. In particular in this example, at time 19:00 (where Avg. CPU %=5.10, Avg. Mem %=15.01, Avg. Band %=0.12, and S=24.5), the supported number of requests (S) is calculated based on stochastic prediction of 100,000 Monte Carlo simulation experiments per calculation cycle using historic data of the parameters at time 19:00, where a $99^{th}$ percentile value is chosen as the supported number (S) of requests. For instance, from the historic data, probability distributions for Avg. CPU %, Avg. Mem % and Avg. Band % values may be determined for the backend content source 102 (for the application 112a) at time 19:00 using mean and standard deviation values. A static supported number of requests (S) relating to the application 112a may then be determined based on end-to-end performance tests (i.e., in this case 25) per instance per second. In connection therewith, the probability distributions are used to generate 100,000 random samples that lie within the distribution, and the supported number of requests (S) is stochastically determined by linking equal weights to all of the origin parameters using Monte Carlo simulation.

It should be appreciated that the Monte Carlo method described in the above example is a probabilistic or a stochastic system for decision-making processes. The state of a stochastic process is randomly determined by analyzing probability distribution through statistical means where the result cannot be predicted precisely. As such, the supported number of requests (S) is deterministic, but due to the randomness in origin parameters and availability of dependent services, its value cannot be precisely calculated. Hence, there is need to stochastically predict this value based, in this example, on Monte Carlo simulation.

The backend content source 102 also determines, at 304, an expected number of requests (E) over a next interval for the application 112a (e.g., from Equation 1, etc.). Specifically, the backend content source 102 determines the expected number of requests (E) by forecasting the number based on seasonal moving average trend linear regression for configured RV prediction intervals. In connection therewith, the expected number of requests (E) may be determined by the backend content source 102 making use of the moving average for a previous four weeks of historic data. That said, the expected number of requests (E) may be represented as transactions per second (TPS), in general, for the requested content. This value is calculated based on adjusting lag forecast errors, non-seasonal, seasonal differences and auto regression parameters.

And, at 306, the backend content source 102 determines the current number of requests (C) for the application 112a (e.g., from Equation 1, etc.). Specifically, the backend content source 102 determines (or derives) the current number of requests (C) from real time origin server access logs, again in transactions per second (TPS). In connection therewith, the current number of requests (C) may be an accumulated incoming request count over a configured interval (e.g., one second, etc.) at origin, which is inferenced by the backend content source 102. In this way, in general, the current number of requests (C) is a snapshot of incoming transactions to the backend content source 102 at any given second.

Next in the method 300, and with the supported, expected and current number of requests for the application 112a determined, the backend content source 102 determines a restriction value (RV), at 308, for the application 112a. Specifically, in this embodiment, the backend content source 102 calculates a ratio of the current number of requests (C) to the supported number of requests (S) (i.e., C/S) and further calculates a ratio of the expected number of requests (E) to the supported number of requests (S) (i.e., E/S). The backend content source 102 then calculates the mean of the two ratios, or $\bar{x}$ (i.e., (C/S+E/S)/2), and calculates the restriction value as 1 minus the mean. The above calculation, by the backend content source 102, is consistent with Equation 1 above.

Then, the backend content source 102 transmits, at 310, the restriction value to the CDN 104. And, the CDN 104, in response, implements the restriction value for requests directed to the backend content source 102 and, in particular, to the application 112a (as generally described above in connection with the system 100).

Finally in the method 300, after transmitting the restriction value to the CDN 104, the backend content source 102 waits for a time interval, at 312. The interval may include a number of minutes or hours, or more or less. In the exemplary embodiment, supported numbers of requests (S) and expected numbers of requests (E) are calculated for a configured wait interval such as once every minute, and RV values may be applied on the CDN 104 during the interval. After the time interval, the method 300 returns to operation 302, whereby the backend content source 102 proceeds with the method 300 to update the restriction value after performing the above operations. Upon receipt of the updated restriction value, the CDN 104 updates the restriction value therein and proceeds to employ the updated value in decisions to pass requests for the application 112a to the backend content source 102 or to offload or route the requests for the application 112a to the waiting room 116.

It should be appreciated that the method 300 may be repeated or separately performed (simultaneously with its performance for the application 112a, or otherwise; etc.) for the application 112b, whereby the restriction value for application 112b is also transmitted to the CDN 104 and updated at one or more intervals.

In view of the above, the systems and methods herein are suited to accommodate surges in requests for content from backend content sources (or, potentially, droughts), whereby waiting rooms are employed and thresholds for routing requests to the waiting rooms, or not, are based at least in part on an actual supported number of requests for the backend content sources. This permits CDNs to tune the number of requests to the backend content sources, and not merely rely on historical and expected request numbers to determine whether or not to route requests to the backend content sources. In this manner, the CDNs avoid overloading the backend content sources, while at the same time also avoiding under loading the backend content sources.

It should be appreciated that the functions described herein, in some embodiments, may be described in computer executable instructions stored on a computer readable media, and executable by one or more processors. The computer readable media is a non-transitory computer readable storage medium. By way of example, and not limitation, such computer-readable media can include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Combinations of the above should also be included within the scope of computer-readable media.

It should also be appreciated that one or more aspects of the present disclosure transform a general-purpose computing device into a special-purpose computing device when configured to perform the functions, methods, and/or processes described herein.

As will be appreciated based on the foregoing specification, the above-described embodiments of the disclosure may be implemented using computer programming or engineering techniques including computer software, firmware, hardware or any combination or subset thereof, wherein the technical effect may be achieved by one or more of: (a) generating, by a computing device associated with a backend content source, a restriction value for content of the backend content source, based on a number of supported requests for the content by the backend content source; (b)

transmitting, by the computing device, the restriction value to a content delivery network (CDN) interposed between one or more clients associated with the requests and the backend content source; (c) routing, by the CDN, a percentage of requests for the content of the backend content source to a waiting room based on the restriction value, thereby permitting the CDN to account for the number of supported requests in offloading requests for the content to the waiting room; (d) determining, by the computing device, the number of supported requests based on a stochastic prediction model; and (e) determining, by the computing device, a number of current requests for the content and a number of expected requests for the content and generating the restriction value for the content is further based on the number of current requests for the content and the number of expected requests for the content.

With that said, exemplary embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular exemplary embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When a feature is referred to as being "on," "engaged to," "connected to," "coupled to," "associated with," "included with," or "in communication with" another feature, it may be directly on, engaged, connected, coupled, associated, included, or in communication to or with the other feature, or intervening features may be present. As used herein, the term "and/or" includes any and all combinations of one or more of the associated listed items. As used herein, the term "and/or" and the phrase "at least one of" are consistent and include any and all combinations of one or more of the associated listed items.

Although the terms first, second, third, etc. may be used herein to describe various features, these features should not be limited by these terms. These terms may be only used to distinguish one feature from another. Terms such as "first," "second," and other numerical terms when used herein do not imply a sequence or order unless clearly indicated by the context. Thus, a first feature discussed herein could be termed a second feature without departing from the teachings of the example embodiments.

The foregoing description of exemplary embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A computer-implemented method of imposing a restriction on requests for content by clients passed to a backend content source, the method comprising:

generating, by a computing device associated with a backend content source, a restriction value (RV) for content of the backend content source, based on: a number of supported requests (S) for the content by the backend content source, a number of current requests (C) for the content, a number of expected requests (E) for the content, and the following equation:

$$RV=1-\text{mean}(C/S, E/S);$$

transmitting, by the computing device, the restriction value to a content delivery network (CDN) interposed between one or more clients associated with the requests and the backend content source; and routing, by the CDN, a percentage of requests for the content of the backend content source to a waiting room based on the restriction value, thereby permitting the CDN to account for the number of supported requests in offloading requests for the content to the waiting room.

2. The method of claim 1, wherein the content includes an application.

3. The method of claim 1, further comprising determining, by the computing device, the number of supported requests based on a stochastic prediction model.

4. The method of claim 3, wherein the stochastic prediction model utilizes Monte Carlo simulation.

5. The method of claim 3, further comprising determining, by the computing device, the number of current requests for the content and the number of expected requests for the content.

6. The method of claim 5, wherein determining the number of current requests for the content includes determining the number of current requests for the content based on real time access logs for the content at the backend content source.

7. The method of claim 6, wherein determining the number of expected requests for the content includes determining the number of expected requests for the content based on a moving average trend linear regression of historic data for the content at the backend content source for a defined interval.

8. The method of claim 1, wherein the restriction value includes a probability of passing the request to the backend content source.

9. The method of claim 1, further comprising determining the number of supported request for the content based on one or more dependencies of the content included in the backend content source.

10. A system for imposing a restriction on requests for content by clients passed to a backend content source, the system comprising:
- at least one backend computing device associated with a backend content source configured to provide content in response to requests by one or more clients; and
- at least one content delivery network (CDN) coupled between the at least one backend computing device and the one or more clients;
- wherein the at least one backend computing device is configured to:
- generate a restriction value (RV) for the content of the backend content source, based on a number of supported requests (S) for the content by the backend content source, a number of current requests (C) for the content, a number of expected requests (E) for the content, and the following equation:

RV=1−mean(C/S,E/S);

transmit the restriction value to the CDN; and
wherein the CDN is configured to route the requests by the one or more clients for the content of the backend content source between the at least one backend computing device and a waiting room based on the restriction value.

11. The system of claim 10, wherein the restriction value includes a probability of passing the request to the backend content source.

12. The system of claim 10, wherein the at least one backend computing device is further configured to determine the number of supported requests based on a stochastic prediction model utilizing Monte Carlo simulation.

13. The system of claim 12, wherein the at least one backend computing device is further configured to determine the number of current requests for the content and the number of expected requests for the content.

14. The system of claim 13, wherein the at least one backend computing device is configured, in connection with determining the number of expected requests for the content, to determine the number of expected requests for the content based on a moving average trend linear regression of historic data for the content at the backend content source for a defined interval.

15. The system of claim 14, wherein the at least one backend computing device is configured, in connection with determining the number of current requests for the content, to determine the number of current requests for the content based on real time access logs for the content at the backend content source.

16. A non-transitory computer readable storage medium including executable instructions for imposing a restriction on requests for content by clients passed to a backend content source, which when executed by at least one processor, cause the at least one processor to:
- generate a restriction value (RV) for content of the backend content source, based on a number of supported requests for the content by the backend content source, a number of current requests for the content, and a number of expected requests for the content, as defined by the following equation:

$$RV = 1 - \operatorname{mean}\left(\frac{C}{S}, \frac{E}{S}\right),$$

where C is the number of current requests for the content, S is the number of supported requests for the content, and E is the number of expected request for the content; and
- transmit the restriction value to a content delivery network (CDN) interposed between one or more clients associated with the requests and the backend content source, whereby a percentage of requests for the content of the backend content source, based on the restriction value, are routed to a waiting room.

17. The non-transitory computer readable storage medium of claim 16, wherein the executable instructions, when executed by the at least one processor, further cause the at least one processor to route the percentage of requests for the content of the backend content source to the waiting room based on the restriction value.

18. The non-transitory computer readable storage medium of claim 16, wherein the executable instructions, when executed by the at least one processor, further cause the at least one processor to determine the number of current requests for the content and the number of expected requests for the content.

* * * * *